United States Patent [19]

Keller et al.

[11] Patent Number: 4,931,751

[45] Date of Patent: Jun. 5, 1990

[54] APPARATUS AND METHOD FOR PRODUCING PULSE WIDTH MODULATED SIGNALS FROM DIGITAL INFORMATION

[75] Inventors: Glenn J. Keller, Los Gatos; Javier A. Solis, Santa Clara, both of Calif.

[73] Assignee: Epyx, Inc., Redwood City, Calif.

[21] Appl. No.: 360,333

[22] Filed: Jun. 2, 1989

[51] Int. Cl.$^5$ .......................... H03K 7/08; H03K 7/10
[52] U.S. Cl. .................................... 332/108; 332/109; 332/115; 375/22; 375/24; 341/53; 341/152
[58] Field of Search ............... 332/108, 109, 110, 115, 332/116; 375/22, 24; 341/53, 144, 152

[56] References Cited

U.S. PATENT DOCUMENTS

| | | | |
|---|---|---|---|
| 4,502,024 | 2/1985 | Nishikawa et al. | 332/109 |
| 4,550,307 | 10/1985 | Akashi et al. | 341/144 |

Primary Examiner—Siegfried H. Grimm
Attorney, Agent, or Firm—Flehr, Hohbach, Test, Albritton & Herbert

[57] ABSTRACT

An apparatus is provided which is responsive to a multiple bit sample of digital information for producing a pulse width modulated signal, the apparatus comprising: a first signal match detector, responsive to a first subset of the multiple bit sample, for producing a first signal that can transition between first and second logical states; a second signal match detector, responsive to a second subset of the multiple bit sample, for producing a second signal that can transition between the first and second logical states; and a voltage summing circuit for producing a first voltage that is substantially proportional to a magnitude of the first signal in one of the first logical state and the second logical state and for producing a second voltage that is substantially proportional to a magnitude of the second signal in one of the first logical state and the second logical state and for producing an output voltage that is substantially proportional to a sum of the first voltage and the second voltage.

32 Claims, 5 Drawing Sheets

APPARATUS AND METHOD FOR PRODUCING PULSE WIDTH MODULATED SIGNALS FROM DIGITAL INFORMATION

BACKGROUND OF THE INVENTION

1. Field of the Invention

The invention relates generally to the sampling of digital information to produce pulse width modulated signals, and more particularly, to an apparatus and method for producing pulse width modulated signals in response to multiple bit samples of digital information.

2. Description of the Related Art

The use of multiple bit samples of digital information to produce pulse width modulated signals is well known. Referring to the illustrative drawing of FIG. 1, for example, there is shown a typical earlier apparatus 20 for producing a pulse width modulated (PWM) signal.

Figure 2:
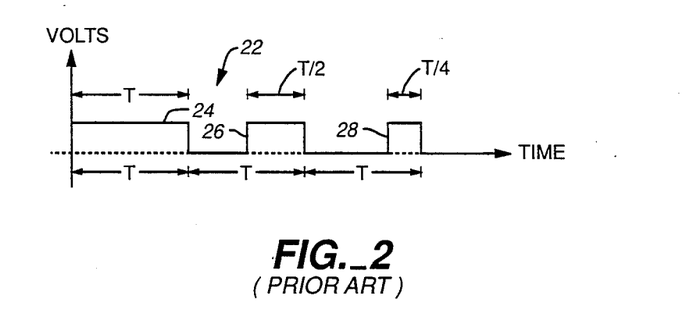
FIG. 2 is an illustrative timing diagram showing an exemplary pulse width modulated signal.

In FIG. 2 there is shown an exemplary PWM signal train 22. The period of the PWM signal is T. The three pulses 24, 26 and 28 shown for the PWM signal train 22 have different pulse-widths, T, T/2 and T/4, respectively.

Figure 1:
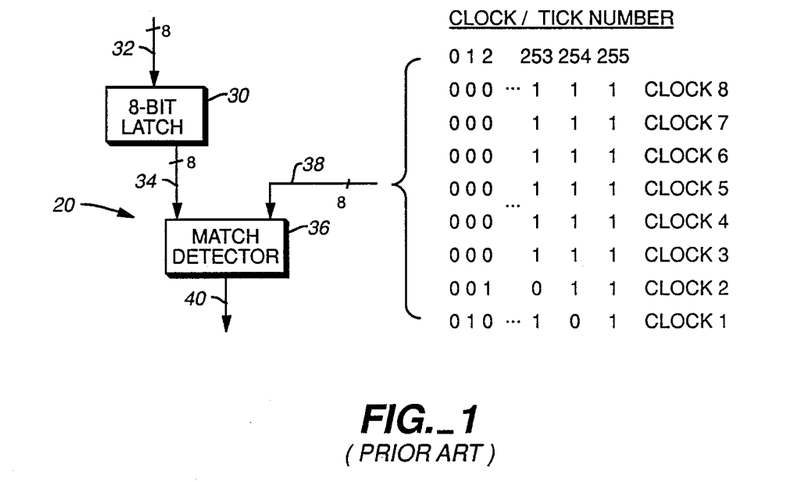
FIG. 1 is a block diagram of an earlier apparatus for producing PWM signals from multiple bit samples of digital information.

The pulse widths of the signal 22, for example, can be modulated in response to the contents of the 8-bit latch 30 of the apparatus 20. More specifically, an 8-bit sample can be loaded into the 8-bit latch 30 via line 32. The contents of the 8-bit latch 30 then can be observed via line 34 by a match detector 36. Eight system clock signals are produced by clocks 1–8 on line 38. The match detector 36 compares the contents of the 8-bit latch 30 with the system clock signals on line 38. When the match detector 36 detects a match between each bit in the 8-bit latch 30 and corresponding bits produced on line 38, it causes a PWM signal on line 40 to transition from a logical zero state to a logical one state.

The clock frequencies of clocks 1–8 are scaled such that clock 1 goes through 256 ticks for every 32 ticks by clock 4 and for every 2 ticks by clock 8. In effect, the system clocks 1–8 act as a binary counter that counts successively from 00000000 (0) to 11111111 ($255_{10}$). Thus, two hundred and fifty-six ticks of clock 1 are required to complete the count. The count repeats for each successive 8-bit sample.

For each tick of clock 1, a different combination of multiple bits is provided on line 38. The match detector 36 performs a bit by bit comparison of each bit of each such combination with corresponding bits stored in the 8-bit latch 30. The width of the pulse during each period of the PWM signal depends upon the contents of the 8-bit latch 30. For example, when the contents of the 8-bit latch are 00000000 (0), pulse 24 is produced. When the contents of the 8-bit latch 30 are 10000000 ($128_{10}$), pulse 26 is produced. When the contents of the 8-bit latch 30 are 11000000 ($192_{10}$), pulse 28 is produced.

While earlier systems and methods for using multiple bit samples of digital information to produce PWM signals generally have been successful, there have been shortcomings with their use. For example, comparing each bit of a multiple bit sample of digital information with a different system clock signal often requires a relatively large number of clock ticks to process each multiple bit sample of digital information. In the exemplary apparatus 20, for example, one 8-bit sample is processed during each PWM time period T, and 256 clock ticks occur during each PWM time period T. Unfortunately, the use of larger numbers of clock ticks per sample of digital information can decrease the sampling rate. A reduced sampling rate can have disadvantages such as slowing the rate at which digital information can be processed and increasing the level of audible noise in PWM signals used to produce audio signals.

Thus, there has been a need for an apparatus and method that uses fewer clock ticks to produce PWM signals from multiple bit samples of digital information. The present invention meets this need.

SUMMARY OF THE INVENTION

The present invention provides an apparatus and related method for producing a pulse width modulated signal from a multiple bit sample of digital information. The apparatus includes a first circuit which produces a first signal in either a first or a second logical state in response to a first subset of bits from the sample. A second circuit produces a second signal in either a first logical state or a second logical state in response to a second subset of bits from the sample. An output providing circuit provides an output at a first value while the first signal is in the first logical state and the second signal is in the second logical state; provides the output at a second value while the first signal is in the second logical state and the second signal is in the first logical state; and provides the output at a third value while the first signal is in the first logical state and the second signal is in the first logical state; and provides a fourth value while the first signal is in the second logical state and the second signal is in the second logical state.

The apparatus and method advantageously permits the sampling of multiple bit samples of digital information using fewer clock ticks because each subset can be sampled with fewer clock ticks. These and other features and advantages of the present invention will become more apparent from the following description of an exemplary embodiment thereof, as illustrated in the accompanying drawings.

BRIEF DESCRIPTION OF THE DRAWINGS

The purpose and advantages of the present invention will be apparent to those skilled in the art from the following detailed description in conjunction with the appended drawings in which.

DETAILED DESCRIPTION OF THE PREFERRED EMBODIMENT

The present invention comprises a novel apparatus and related method for producing pulse width modulated (PWM) signals in response to multiple bit samples of digital information. The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

Figure 3:
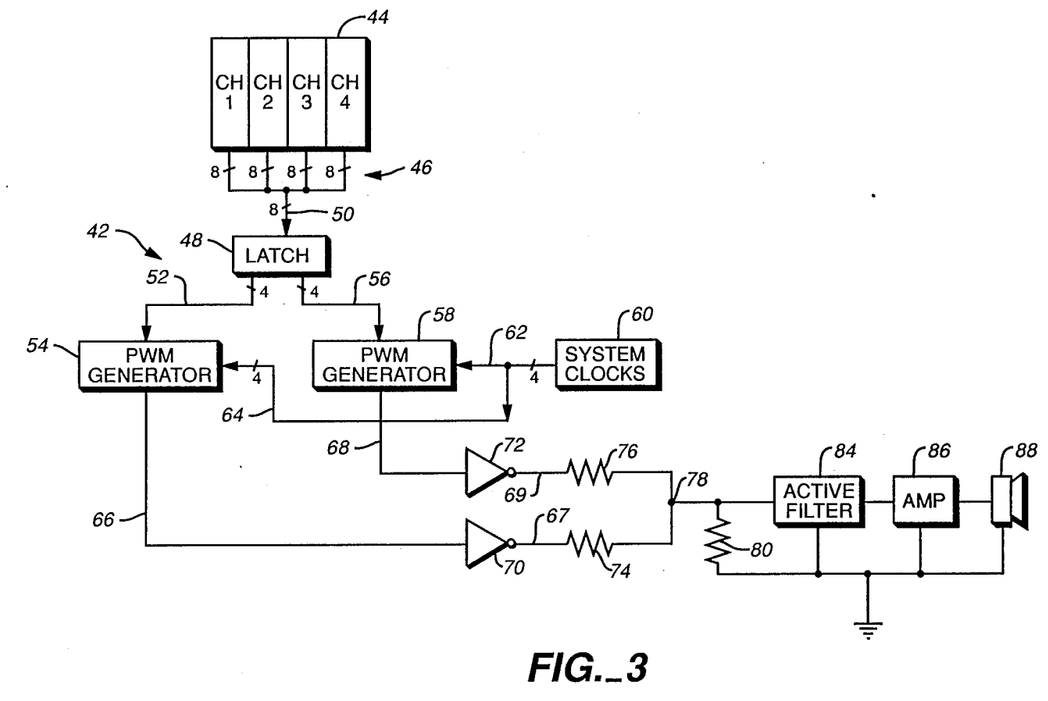
FIG. 3 is an exemplary block diagram that illustrates a system which includes an apparatus in accordance with the present invention.

FIG. 3 shows a block diagram of a system 42 which includes an apparatus in accordance with the present invention. The system 42 includes four 8-bit channels 44, each of which provides 8-bit bytes of digital information via lines 46. In operation, an 8-bit byte provided by channel 1 is loaded into 8-bit latch 48 via line 50 and is processed in accordance with the present invention as described below so as to produce a PWM output signal at node 78. Subsequently, respective 8-bit bytes provided on channels 2-4 are sequentially loaded into the latch 48 and are similarly processed to provide additional PWM output signals at node 78. After the respective 8-bit bytes from each of the four channels 44 have been sampled, the sampling process repeats, and channels 1-4 are once again sampled in sequence. In this manner, a series of PWM output signals can be produced from 8-bit bytes sampled from the four channels 44. It will be appreciated that between samplings, the respective 8-bit bytes provided on the four respective channels 44 can be updated.

As explained more fully below, the presently preferred embodiment of the present invention advantageously reduces the number of clock ticks required to produce PWM output signals from multiple bit samples of digital information. More specifically, each digital sample loaded into latch 48 is separated into two multiple bit subsets which are separately processed by first and second PWM generators 54 and 58. Since each subset has fewer bits than the original sample, the subsets can be processed using fewer clock ticks on lines 62 and 64. Separate PWM signals are provided on lines 67 and 69 for each subset, and these signals are combined at node 78 so as to produce a PWM output waveform in which pulse-width and pulse magnitudes depend upon the logical states of the multiple bits of each of the two samples.

For each 8-bit sample, a first multiple bit subset of the sample is provided via line 52 to the first PWM generator 54, and a second multiple bit subset is provided via line 56 to the second PWM generator 58. The first subset includes the upper four bits of the 8-bit sample, and the second subset includes the lower four bits of the 8-bit sample.

A system clock generator 60 produces on lines 62 and 64 four respective clock signals having frequencies that are scaled such that the combination of signals on lines 62 and 64 each provide a 4-bit binary count that proceeds from 0000 (0) through 1111 ($15_{10}$) and then repeats.

The first PWM generator 54 provides on line 66 an inverted version of a first signal. For each respective 8-bit sample, the system clock generator 60 provides on line 64 a sequence of 4-bit signals that counts upward from 0000 to 1111, and the first PWM generator 54 provides o line 66 the inverted version of the first signal which initially is in a second logical state. In the presently preferred embodiment, the second logical state is the logical 1 state. As the system clock generator 60 increments the count sequence on line 64, the PWM generator 54 compares each respective bit of the first subset with corresponding bits from the count sequence on line 64. When the PWM generator 54 detects a match between each bit of the first subset and corresponding bits of one of the respective multiple bit combinations in the sequence, the generator 54 causes the inverted first signal on line 66 to transition from the second logical state to a first logical state. In the presently preferred embodiment, the first logical state is the logical 0 state.

Similarly, the second PWM generator 58 provides on line 68 an inverted version of a second signal. For each respective 8-bit sample, the system clock generator 60 initially provides on line 62 a sequence of 4-bit signals that counts upward from 0000 to 1111, and the PWM generator 58 provides on line 68 the inverted version of the second signal which initially is in the second logical state. As the system clock generator 60 increments the count sequence on line 62, the PWM generator 58 compares each respective bit of the second subset with corresponding bits from the count sequence on line 62. When the PWM generator 58 detects a match between each of the four bits of the second subset and corresponding bits of a 4-bit combination from the sequence, it causes the second signal on line 68 to transition from the second logical state to the first logical state.

For each respective 8-bit sample, the respective first and second logical signals remain in the first logical state following the respective transitions until the system clock generator 60 causes the count on lines 62 and 64 to reach 1111 and to start again at 0000. The respective first and second PWM generators 54, 58 then cause the first and second signals to transition back to the second logical state.

In the presently preferred embodiment, the 8-bit latch 48 and the first and second PWM generators 54, 58 are implemented in an integrated circuit. First and second buffers 70, 72 interface the first and second signals to respective first and second summing resistors 74, 76.

The first and second buffers 70, 72 logically invert the signals on lines 66 and 68 such that the first signal is provided to the first resistor in noninverted form, and such that the second signal is provided to the second resistor in noninverted form. Thus, the first signal is provided in noninverted form on line 67, and the second signal is provided in noninverted form on line 69.

The respective first and second summing resistors 74, 76 are coupled as shown such that an output voltage at output node 78 is approximately proportional to a sum of the voltages produced in response to the passage of the first signal through the first summing resistor 74 and the passage of the second signal through the second summing resistor 76. A voltage divider resistor 80 is coupled between the output node 78 and ground potential.

In the presently preferred embodiment, the first summing resistor has a value of 7.5K ohms. The second summing resistor has a value of 120K ohms. The voltage divider resistor has a value of 30K ohms.

An active filter 84, coupled as shown, serves as a low pass filter to provide high frequency filtering of the output at node 78. An amplifier circuit 86 amplifies the filtered output and provides an amplified version of the output to an audio speaker 88.

Figure 4:
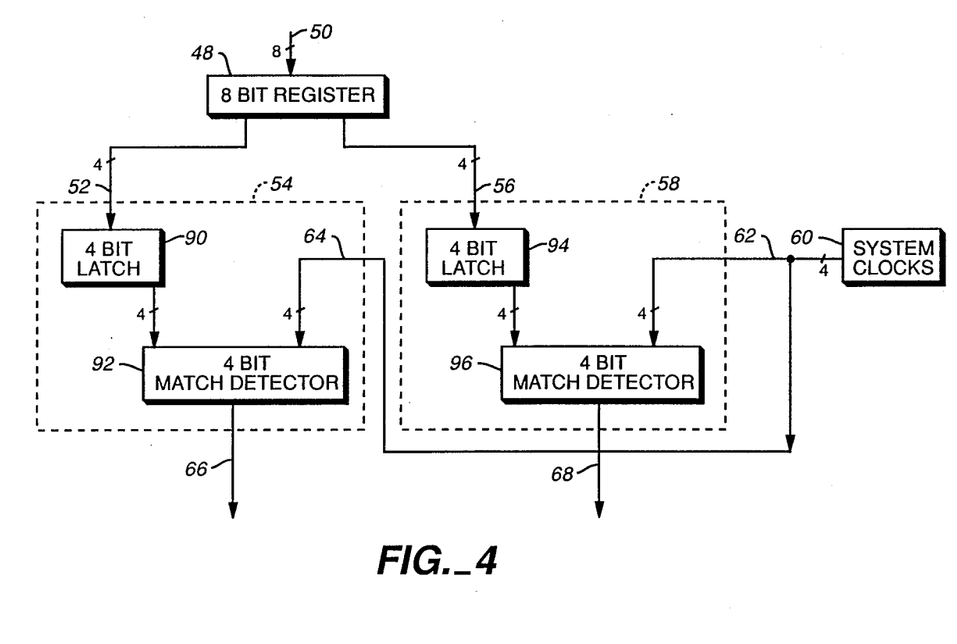
FIG. 4 is an illustrative block diagram that shows details of the first and second PWM generators of FIG. 3.

The illustrative block diagram of FIG. 4 shows additional details of the first and second PWM generators 54, 58. The first PWM generator 54 includes a first 4-bit latch 90 and a first 4-bit match detector 92. Similarly, the second PWM generator 58 includes a second 4-bit latch 94 and a second 4-bit match detector 96.

The first 4-bit latch 90 receives the first 4-bit subset from the 8-bit latch 48 via line 52. The first 4-bit match detector 92 observes the contents of the first 4-bit latch 90 in the course of the progression of the count sequence on line 64. When a match is detected, the first match detector 92 causes the first signal on line 66 to transition from the first logical state to the second logical state and to remain in the second logical state until the count sequence completes.

The first PWM generator 54 operates in an identical manner for each first 4-bit subset of each 8-bit sample loaded into register 48. The second PWM generator 58 operates in a substantially identical manner to the first PWM generator 54 for each 4-bit second subset of each 8-bit sample provided to the register 48.

Figure 5:
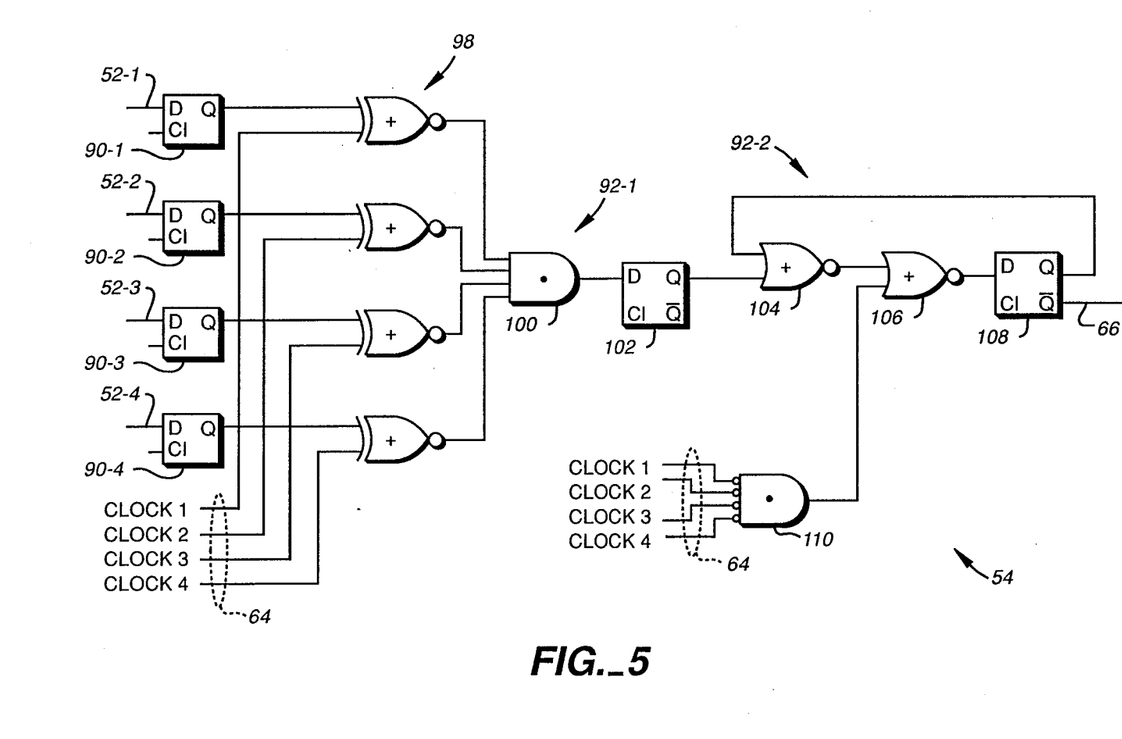
FIG. 5 is a schematic drawing which shows details of the first PWM generator of FIGS. 3 and 4.

The schematic drawings of FIG. 5 show still further details of the first PWM generator 54. The first 4-bit latch 90 includes four D-flip flops 90-1 through 90-4 which respectively receive one bit of data apiece via lines 52-1 through 52-4. The first 4-bit match detector 92 includes match detection circuitry 92-1 and signal transition control circuitry 92-2. The match detection circuitry 92-1 includes four Exclusive-NOR gates 98 coupled as shown between the D-flip flops and a four input AND gate 100. The output of the AND gate 100 is coupled to the D input of D-flip flop 102.

The signal transition control circuitry 92-2 includes first and second NOR gates 104 and 106 and D-flip flop 108 and AND gate 110, coupled as shown. The first NOR gate 104 receives as one of its inputs the Q output of D-flip flop 102. The AND gate 110 receives as its four inputs inverted versions of the clock count signals on lines 64. The second NOR gate 106 receives as one of its inputs the output of AND gate 110. The $\bar{Q}$ output of D-flip flop 108 provides the inverted version of the first signal on line 66.

Figure 6:
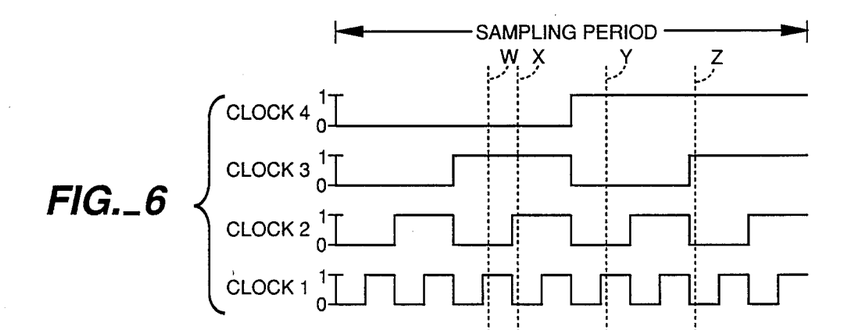
FIG. 6 shows a timing diagram which illustrates a sequence of clock signal combinations produced on lines 62 and 64 in FIG. 3.

The operation of the system 42 now will be described with reference to the exemplary timing diagrams of FIGS. 6, 7 and 8. FIG. 6 shows the series of clock signals produced on lines 62 and 64 by clocks 1-4 of the system clock generator 60. Reading vertically downward in FIG. 6, the count sequence proceeds from 0000 through 0101 (at point W) through 1001 (at point Y) to 1111, after which the sequence repeats.

Figure 7:
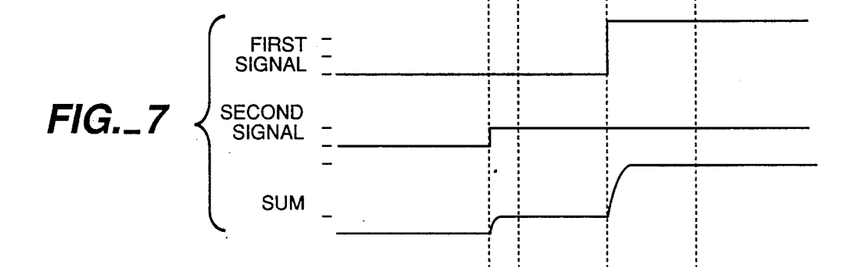
FIG. 7 shows timing diagrams that illustrate respective PWM voltage waveforms produced at node 78 of FIG. 3.

The timing diagrams of FIG. 7 illustrate PWM voltage signals produced at node 78 when an 8-bit sample in the form 10010101 has been loaded into the 8-bit latch 48. Referring to FIG. 4, the first 4-bit subset loaded into the first 4-bit latch 90 is in the form 1001, and the second 4-bit subset loaded into the second 4-bit latch 94 is in the form 0101.

Referring now to the schematic diagram of the first PWM generator shown in FIG. 5, D-flip flops 90-1 and 90-4 each are loaded with logical state 1 bits, and D-flip flops 90-2 and 90-3 each are loaded with logical state 0 signals. The contents of the D-type flip flops 90-1 through 90-4 are provided to the Exclusive-OR gates as is each respective combination of bits in the count sequence on lines 64. The contents of D-flip flop 90-1 are compared bit by bit with the sequence of bits provided by clock 1. The contents of the D-flip flop 90-2 are compared bit by bit with the sequence of bits provided by clock 2. The contents of D-flip flop 90-3 are compared bit by bit with the sequence of bits provided by Clock 3. The contents of D-flip flop 90-4 are compared bit by bit with the sequence of bits provided by clock 4.

When the count sequence reaches the respective bit combination 1001, indicated by the arrow Y in the timing diagram of FIG. 6, the bits of the first subset stored in the D-flip flops 90-1 through 90-4 match the corresponding bits in the respective bit combination. As a result, AND gate 100 provides a logical 1 state signal to D-flip flop 102, and the signal transition control logic 92-2 cause the inverted first signal on line 66 to transition from the second logical state to the first logical state.

The timing diagram of FIG. 7 labelled "First Signal" illustrates a first PWM voltage waveform produced at node 78 in response to the first subset in the form 1001. It will be understood that the first signal on line 67 transitions from a first logical state (logical 0) to a second logical state (logical 1) in response to the detection of a match. It will be further appreciated that a first voltage produced at node 78 due to the first signal is approximately proportional to the magnitude of the first signal. In the presently preferred embodiment, the magnitude of the first signal increases when it transitions from the first to the second logical states. In the presently preferred embodiment, when the count sequence reaches 1001 indicated by arrow Y in FIG. 6, the first PWM voltage waveform produced at node 78 due to the first signal transitions from approximately 0 volts to approximately 4.7 volts.

In a similar manner, the second signal on line 69 produces a second PWM voltage waveform at node 78 in response to the second 4-bit subset 0101. The second PWM voltage waveform is labelled "Second Signal" in the timing diagram of FIG. 7. The second voltage produced at node 78 due to the second signal is approximately proportional to the magnitude of the second signal. In the presently preferred embodiment, the magnitude of the second voltage increases when it transitions from the first to the second logical states. In the presently preferred embodiment, when the count sequence reaches 0101 indicated by arrow W in FIG. 6, the second PWM voltage waveform produced at node 78 due to the second signal transitions from approximately 0 volts to approximately 0.3 volts.

Of course, the difference in the magnitudes of the first and second voltages after their respective transitions from the first to the second logical states is due at least in part to the difference in the values of the first and second summing resistors 74 and 76. As explained below, this voltage difference is used to indicate whether or not the first subset or the second subset or both has achieved a match with a respective clock signal combination.

The timing diagram of FIG. 7 labelled "Sum" illustrates a PWM output voltage waveform produced at the node 78 in response to a combination of the first and second PWM voltage waveforms. When the count reaches 0101 (at arrow W), the output voltage begins to transition to approximately 0.3 volts due to the match between the first subset and the clock count. When the count reaches 1001 (at arrow Y), the output voltage begins to transition from approximately 0.3 volts to approximately 5.0 volts due to the match between the first subset and the clock count.

Figure 8:
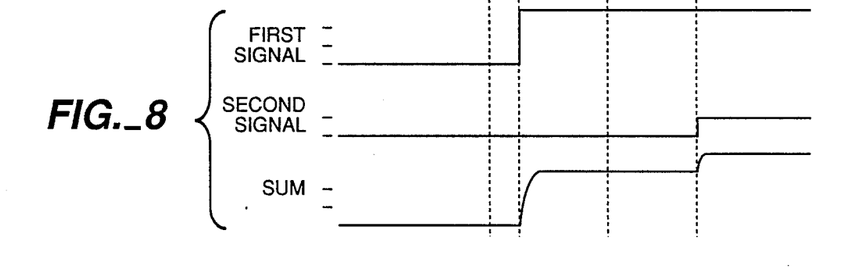
FIG. 8 shows timing diagrams that illustrate additional PWM voltage waveforms produced at node 78 of FIG. 3.

The timing diagrams of FIG. 8 illustrate the respective first, second and output voltage PWM waveforms produced at node 78 in response to an 8-bit sample in the form 01101100. As shown by the timing diagram of FIG. 9 labelled "First Signal", when the count reaches 0110 indicated by arrow X in FIG. 6, a first PWM voltage waveform produced at node 78 due to the first signal transitions from approximately 0 volts to approximately 4.7 volts. As shown by the timing diagram labelled "Second Signal", when the count reaches 1100 indicated by arrow Z, a second PWM voltage waveform produced at node 78 due to the second signal transitions from approximately 0 volts to approximately 0.3 volts.

The timing diagram of FIG. 8 labelled "Sum" illustrates that a PWM output voltage waveform produced at node 78 due to the combination of the first and second voltages begins to transition from approximately 0 volts to approximately 4.7 volts when the count reaches 0110 at arrow X. Furthermore, the PWM output voltage waveform produced at node 78 begins to transition from approximately 4.7 volts to approximately 5.0 volts when the count reaches 1100 at arrow Z.

Thus, as illustrated in the respective timing diagrams labelled "Sum" in FIGS. 7 and 8, the output voltage produced at node 78 can take on at least four different values: 0 volts when both the first and second signals are in the first logical state, 0.3 volts when the first signal is in the first logical state and the second signal is in the second logical state, 4.7 volts when the first signal is in the second logical state and the second signal is in the first logical state, and 5.0 volts when both the first and second signals are in the second logical state.

Therefore, the apparatus and method of the present invention advantageously permits the use of fewer clock ticks to produce a PWM output waveform from a multiple bit digital sample. More specifically, the apparatus and method of the present invention permits the production of a PWM output waveform in which pulse width indicates the point in time when a match between one of the two subsets and the clock count has occurred and in which pulse magnitude indicates which of the two subsets has experienced a match.

Various modifications to the preferred embodiment can be made without departing from the invention. For example, instead of using Exclusive-NOR gates in the match detectors 92, 96, Exclusive-OR gates could be used. In that case, a match between a subset of bits and a count could be declared when each of the bits of the subset was the logical inverse of the corresponding bit of the clock count to which it is compared. More particularly, for example, in that case a subset in the form 1010 would match the clock count 0101.

Thus, the foregoing description is not intended to limit the invention which is defined by the appended claims in which:

It is claimed:

1. An apparatus, responsive to a multiple bit sample of digital information, for producing a pulse width modulated signal, comprising:

first means, responsive to a first subset of the multiple bit sample, for producing a first signal that can transition between first and second logical states;

second means, responsive to a second subset of the multiple bit sample, for producing a second signal that can transition between the first and second logical states; and third means for producing a first voltage that is substantially proportional to a magnitude of the first signal in one of the first logical state and the second logical state and for producing a second voltage that is substantially proportional to a magnitude of the second signal in one of the first logical state and the second logical state and for producing an output voltage that is substantially proportional to a sum of the first voltage and the second voltage.

2. The apparatus of claim 1, wherein said third means includes first resistive means for producing the first voltage in response to the first signal and second resistive means for producing the second voltage in response to the second signal.

3. The apparatus of claim 1,
wherein said third means produces the output voltage substantially at a first value while the first signal is in the first logical state and the second signal is in the second logical state;
wherein said third means produces the output voltage substantially at a second value while the first signal is in the second logical state and the second signal is in the first logical state; and
wherein said third means produces the output voltage substantially at a third value while the first signal is in the first logical state and the second signal is in the first logical state.

4. The apparatus of claim 3, wherein said third means produces the output voltage substantially at a fourth value while the first signal is in the second logical state and the second signal is in the second logical state.

5. The apparatus of claim 3, wherein the second value is greater than the first value.

6. The apparatus of claim 3, wherein the fourth value is greater than the third value.

7. The apparatus of claim 1,
wherein said third means includes first resistive means for producing the first voltage in response to the first signal and includes second resistive means for producing the second voltage in response to the second signal;
wherein said first and second resistive means are coupled at a node such that substantially the sum of the first and second voltages is produced at the node as the output voltage.

8. The apparatus of claim 7, wherein said third means includes third resistive means coupled between the node and ground potential.

9. The apparatus of claim 1, wherein the first subset and the second subset include the same number of bits.

10. The apparatus of claim 1, and further comprising:
fourth means for defining a sampling time period;
wherein said first means produces the first signal during the sampling time period; and
wherein said second means produces the second signal during the sampling time period.

11. The apparatus of claim 1, and further comprising:
fourth means for defining a sampling time period;
wherein said first means produces the first signal such that the first signal can transition only once between the first and second logical states during the sampling time period; and
wherein said second means produces the second signal such that the second signal can transition only once between the first and second logical states during the sampling time period.

12. The apparatus of claim 1, and further comprising:
bit sequencing means for producing a sequence of respective multiple bit combinations;
wherein said first means includes match detection means for detecting a respective first match between each respective bit of the first subset and respective corresponding bits of a respective multiple bit combination from the sequence; and
wherein said second means includes match detection means for detecting a respective second match between each respective bit of the second subset and respective corresponding bits of a respective multiple bit combination from the sequence.

13. The apparatus of claim 12, wherein said bit sequencing means includes means for producing a binary count sequence.

14. The apparatus of claim 12, wherein the first subset and the second subset and each respective multiple bit combination from the sequence include the same number of bits.

15. The apparatus of claim 1, and further comprising:
bit sequencing means for producing a sequence of respective multiple bit combinations;
wherein said first means includes match detection means for detecting a respective first match between each respective bit of the first subset and corresponding bits of a respective multiple bit combination from the sequence and for causing the first signal to transition between the first and second logical states in response to a detection of the first match; and
wherein said second means includes match detection means for detecting a respective second match between each respective bit of the second subset and respective corresponding bits of a respective multiple bit combination from the sequence and for causing the second signal to transition between the first and second logical states in response to a detection of the second match.

16. The apparatus of claim 1, and further comprising:
bit sequencing means for producing at least one sequence of respective multiple bit combinations during each one of a sequence of respective sampling time periods;
wherein said first means includes match detection means for detecting a respective first match between each respective bit of the first subset and corresponding bits of a respective multiple bit combination from the sequence;
wherein said first means produces the first signal in one of the first and second logical states before a detection of the first match and produces the first signal in the other of the first and second logical states after the detection of the first match;
wherein said second means includes match detection means for detecting a respective second match between each respective bit of the second subset and corresponding bits of a respective multiple bit combination from the sequence; and
wherein said second means produces the second signal in one of the first and second logical states before a detection of the second match and produces the second signal in the other of the first and second logical states after the detection of the second match.

17. An apparatus, responsive to a multiple bit sample of digital information, for producing a pulse width modulated signal, comprising:
first means, responsive to a first subset of the multiple bit sample, for producing a first signal that can transition between first and second logical states;
second means, responsive to a second subset of the multiple bit sample, for producing a second signal that can transition between the first and second logical states; and
third means for producing an output;
wherein said third means produces the output substantially at a first value while the first signal is in the first logical state and the second signal is in the second logical state;
wherein said third means produces the output substantially at a second value while the first signal is in the second logical state and the second signal is in the first logical state; and
wherein said third means produces the output substantially at a third value while the first signal is in the first logical state and the second signal is in the first logical state.

18. The apparatus of claim 17, wherein said third means produces the output substantially at a fourth value while the first signal is in the second logical state and the second signal is in the second logical state.

19. The apparatus of claim 17, wherein the first subset and the second subset include the same number of bits.

20. The apparatus of claim 17, and further comprising:
fourth means for defining a sampling time period;
wherein said first means produces the first signal during the sampling time period; and
wherein said second means produces the second signal during the sampling time period.

21. The apparatus of claim 17, and further comprising:
fourth means for defining a sampling time period;
wherein said first means produces the first signal such that the first signal can transition only once between the first and second logical states during the sampling time period; and
wherein said second means produces the second signal such that the second signal can transition only once between the first and second logical states during the sampling time period.

22. The apparatus of claim 17, and further comprising:
bit sequencing means for producing a sequence of respective multiple bit combinations;
wherein said first means includes match detection means for detecting a respective first match between each respective bit of the first subset and respective corresponding bits of a respective multiple bit combination from the sequence; and
wherein said second means includes match detection means for detecting a respective second match between each respective bit of the second subset and respective corresponding bits of a respective multiple bit combination from the sequence.

23. The apparatus of claim 22, wherein said bit sequencing means includes means for producing a binary count sequence.

24. The apparatus of claim 22, wherein the first subset and the second subset and each respective multiple bit combination from the sequence include the same number of bits.

25. The apparatus of claim 17, and further comprising:
- bit sequencing means for producing a sequence of respective multiple bit combinations;
- wherein said first means includes match detection means for detecting a respective first match between each respective bit of the first subset and corresponding bits of a respective multiple bit combination from the sequence and for causing the first signal to transition between the first and second logical states in response to a detection of the first match; and
- wherein said second means includes match detection means for detecting a respective second match between each respective bit of the second subset and respective corresponding bits of a respective multiple bit combination from the sequence and for causing the second signal to transition between the first and second logical states in response to a detection of the second match.

26. The apparatus of claim 17, and further comprising:
- bit sequencing means for producing at least one sequence of respective multiple bit combinations during each one of a sequence of respective sampling time periods;
- wherein said first means includes match detection means for detecting a respective first match between each respective bit of the first subset and corresponding bits of a respective multiple bit combination from the sequence;
- wherein said first means produces the first signal in one of the first and second logical states before a detection of the first match and produces the first signal in the other of the first and second logical states after the detection of the first match;
- wherein said second means includes match detection means for detecting a respective second match between each respective bit of the second subset and corresponding bits of a respective multiple bit combination from the sequence; and
- wherein said second means produces the second signal in one of the first and second logical states before a detection of the second match and produces the second signal in the other of the first and second logical states after the detection of the second match.

27. An apparatus, responsive to a multiple bit sample of digital information, for producing a pulse width modulated signal, comprising:
- bit sequencing means for producing a sequence of multiple bit combinations;
- first means, responsive to a first subset of the multiple bit sample, for producing a first signal that can transition between first and second logical states;
- wherein said first means includes match detection means for detecting a respective first match between each respective bit of the first subset and corresponding bits of a respective multiple bit combination from the sequence and for causing the first signal to transition between the first and second logical states in response to a detection of the first match;
- second means, responsive to a second subset of the multiple bit sample, for producing a second signal that can transition between the first and second logical states;
- wherein said second means includes match detection means for detecting a respective second match between each respective bit of the second subset and respective corresponding bits of a respective multiple bit combination from the sequence and for causing the second signal to transition between the first and second logical states in response to a detection of the second match;
- third means for producing an output;
- wherein said third means produces the output substantially at a first value in response to the first signal in the first logical state and the second signal in the second logical state;
- wherein said third means produces the output substantially at a second value in response to the first signal in the second logical state and the second signal in the first logical state; and
- wherein said third means produces the output substantially at a third value in response to the first signal in the first logical state and the second signal in the first logical state.

28. An apparatus, responsive to a multiple bit sample of digital information, for producing a pulse width modulated signal, comprising:
- bit sequencing means for producing at least one sequence of respective multiple bit combinations during each one of a sequence of respective sampling time periods;
- first means, responsive to a first subset of the multiple bit sample, for producing a first signal that can transition between first and second logical states;
- wherein said first means includes match detection means for detecting a respective first match between each respective bit of the first subset and corresponding bits of a respective multiple bit combination from the sequence;
- wherein said first means produces the first signal in one of the first and second logical states before a detection of the first match and produces the first signal in the other of the first and second logical states after the detection of the first match;
- second means, responsive to a second subset of the multiple bit sample, for producing a second signal that can transition between the first and second logical states;
- wherein said second means includes match detection means for detecting a respective second match between each respective bit of the second subset and corresponding bits of a respective multiple bit combination from the sequence;
- wherein said second means produces the second signal in one of the first and second logical states before a detection of the second match and produces the second signal in the other of the first and second logical states after the detection of the second match;
- third means for producing an output;
- wherein said third means includes first resistive means for producing the first voltage in response to the first signal and includes second resistive means for producing the second voltage in response to the second signal; and
- wherein said first and second resistive means are coupled such that substantially the sum of the first and second voltages is produced as the output.

29. A method for producing a pulse width modulated signal from a multiple bit sample of digital information, the method comprising the steps of:

separating the multiple bit sample of digital information into respective first and second subsets of the multiple bit sample of digital information;

producing a sequence of respective multiple bit combinations;

producing a first signal that can transition between first and second logical states;

producing a second signal that can transition between the first and second logical states;

comparing each respective bit of the first subset to corresponding bits of respective multiple bit combinations from the sequence;

transitioning the first signal between the first and second logical states in response to a detection of a first match in which each respective bit of the first subset matches a corresponding bit from a respective multiple bit combination from the sequence;

comparing each respective bit of the second subset to corresponding bits of respective multiple bit combinations from the sequence;

transitioning the second signal between the first and second logical states in response to a detection of a second match in which each respective bit of the second subset matches a corresponding bit from a respective multiple bit combination from the sequence;

producing a first voltage that is substantially proportional to a magnitude of the first signal in one of the first logical state and the second logical state;

producing a second voltage that is substantially proportional to a magnitude of the second signal in one of the first logical state and the second logical state; and producing an output voltage that is substantially proportional to a sum of the first voltage and the second voltage.

30. A method for producing a pulse width modulated signal from a multiple bit sample of digital information, the method comprising the steps of:

separating the multiple bit sample of digital information into respective first and second subsets of the multiple bit sample of digital information;

producing a sequence of respective multiple bit combinations;

producing a first signal that can transition between first and second logical states;

producing a second signal that can transition between first and second logical states;

comparing each respective bit of the first subset to corresponding bits of respective multiple bit combinations from the sequence;

transitioning the first signal between the first and second logical states in response to a detection of a first match in which each respective bit of the first subset matches a corresponding bit from a respective multiple bit combination from the sequence;

comparing each respective bit of the second subset to corresponding bits of respective multiple bit combinations from the sequence;

transitioning the second signal between the first and second logical states in response to a detection of a second match in which each respective bit of the second subset matches a corresponding bit from a respective multiple bit combination from the sequence;

producing an output voltage;

wherein the output voltage is produced substantially at a first value while the first signal is in the first logical state and the second signal is in the second logical state;

wherein the output voltage is produced substantially at a second value while the first signal is in the second logical state and the second signal is in the first logical state;

wherein the output voltage is produced substantially at a third value while the first signal is in the first logical state and the second signal is in the first logical state; and wherein the output voltage is produced substantially at a fourth value while the first signal is in the second logical state and the second signal is in the second logical state.

31. The method of claim 29 or 30, wherein said step of producing the first signal includes producing the first signal in a first logical state before the step of transitioning the first signal and producing the first signal in the second logical state after the step of transitioning the first signal.

32. The method of claim 29 or 30, wherein said step of producing the first signal includes producing the first signal in a first logical state before the step of transitioning the first signal and producing the first signal in the second logical state after the step of transitioning the first signal; and wherein said step of producing the second signal includes producing the second signal in a first logical state before the step of transitioning the second signal and producing the second signal in the second logical state after the step of transitioning the second signal.

* * * * *